(12) United States Patent
Gilbert

(10) Patent No.: US 6,894,564 B1
(45) Date of Patent: May 17, 2005

(54) VARIABLE-GAIN AMPLIFIER HAVING ERROR AMPLIFIER WITH CONSTANT LOOP GAIN

(75) Inventor: Barrie Gilbert, Portland, OR (US)

(73) Assignee: Analog Devices, Inc., Norwood, MA (US)

( * ) Notice: Subject to any disclaimer, the term of this patent is extended or adjusted under 35 U.S.C. 154(b) by 37 days.

(21) Appl. No.: 10/673,095

(22) Filed: Sep. 25, 2003

Related U.S. Application Data

(60) Provisional application No. 60/485,830, filed on Jul. 7, 2003.

(51) Int. Cl.[7] .................................................. H03F 3/45
(52) U.S. Cl. ......................................... 330/254; 330/69
(58) Field of Search ............................... 330/252, 254, 330/260, 261, 69; 327/359

(56) References Cited

U.S. PATENT DOCUMENTS 6,084,472 A * 7/2000 Gilbert ....................... 330/254
6,600,372 B2 * 7/2003 Prentice ...................... 330/254
6,614,303 B2 * 9/2003 Nentwig ...................... 330/254
6,784,741 B1 * 8/2004 Redman-White ........... 330/283

* cited by examiner

Primary Examiner—Henry Choe
(74) Attorney, Agent, or Firm—Marger Johnson & McCollom, PC

(57) ABSTRACT

A translinear amplifier is disclosed. A loop amplifier drives the bases of the input and output transistor pairs from the differential collector voltage of the input pair. The loop amplifier contains a third differential pair (a gain pair). The tail current of the gain pair is inversely related to the tail current of the input pair, such that loop amplifier gain remains stable when the transconductance of the input pair changes (due, e.g., to input gain changes). In one embodiment, a linear-in-dB interface is provided that adjusts input pair tail current exponentially (and gain pair tail current exponentially and inversely) to linear voltage changes at a gain input.

26 Claims, 9 Drawing Sheets

VARIABLE-GAIN AMPLIFIER HAVING ERROR AMPLIFIER WITH CONSTANT LOOP GAIN

This application claims priority from U.S. Provisional Patent Application Ser. No. 60/485,830 filed on Jul. 7, 2003 titled, which is incorporated herein by reference.

BACKGROUND OF THE INVENTION

1. Field of the Invention

This invention pertains generally to amplifiers, and more particularly to translinear variable-gain amplifiers.

2. Background of the Invention

FIG. 1 illustrates a basic translinear amplifier 10. Translinear refers to the linear dependence of a bipolar transistor's transconductance upon its collector current. Amplifier 10 uses translinear principles to amplify a differential current.

In FIG. 1, amplifier 10 has a first differential transistor pair Q1, Q2 with a current source (having a current magnitude $2I_D$) regulating their summed tail currents. Amplifier 10 also has a second differential transistor pair Q3, Q4 with a second current source (having a current magnitude $2I_N$) regulating their summed tail currents. The bases of Q1 and Q4 are connected, and the bases of Q2 and Q3 are connected. The collectors of Q1 and Q2 are coupled to the connected bases through a loop amplifier 12, which may be nothing more than a pair of emitter followers.

The operation of this basic translinear amplifier was analyzed in Barrie Gilbert, "A New Wide-band Amplifier Technique", *IEEE J. Solid-State Circuits*, vol. SC-3, no. 4, pp. 353–365 (December 1968). Assuming that the transistors are matched, the common base connections between the inner and outer transistors and the common emitter connections within the pairs force the current ratio between Q1 and Q2 to equal the current ratio between Q3 and Q4. When no differential current is applied to nodes A and B, a current $I_D$ passes through each of Q1 and Q2, and a current $I_N$ passes through each of Q3 and Q4. When a differential current is applied to Q1 and Q2, it can be defined in terms of a modulation factor x that can vary between −1 and +1, as shown for a differential input current $xI_D$. This modulation factor is replicated at the output pair Q3, Q4, modulating the output tail current by the same factor x. The current gain of this cell is simply the ratio of the tail currents, i.e., $I_N/I_D$.

Amplifier 10 is useful in variable-gain amplifiers (VGAs) and multipliers. It can be configured as an input VGA (IVGA) by providing for control of the input tail current. In this configuration it is useful, e.g., for conditioning an input signal with a wide dynamic range (such as a received RF signal) before presenting that signal to circuitry that expects signals in a fairly constant range (e.g., automatic gain control applications). The gain varies hyperbolically with changes in the input tail current.

Amplifier 10 can also be configured as an output VGA (OVGA) by providing for control of the output tail current. In this configuration it is useful, e.g., for variable output power/drive applications. Also, since the output current varies linearly with changes in the output tail current, an appropriately designed OVGA can be used as a multiplier.

SUMMARY OF THE INVENTION

As with many circuits, everything is not as simple as it seems with the basic amplifier of FIG. 1. Going from the simple core shown in FIG. 1 to a versatile, high-performance integrated circuit part involves the recognition and solution of a variety of difficult problems, many interrelated, that are addressed within the substance of this disclosure. As will be shown in the detailed description, embodiments of the present invention can realize remarkable properties, including an extremely wide dynamic range, the ability to function simultaneously as a linear-in-dB IVGA and a linear-in-magnitude OVGA, low distortion, and an AC response that remains flat over an extremely wide range of frequencies.

A key aspect of the embodiments is coordinated control of the input tail current and the gain of the loop amplifier that supplies current to the differential pair base connections. The loop amplifier gain varies inversely with input tail current (which is also a factor in overall loop gain) such that overall loop gain remains very nearly constant. In preferred embodiments, the loop amplifier contains a differential current stage with a controlled tail current; both this controlled tail current and the input pair tail current are produced by exponential current generators that vary inversely with each other.

Many other features are disclosed that, when combined with the basic loop amplifier control just described, enhance the capabilities and/or performance of the disclosed amplifier.

BRIEF DESCRIPTION OF THE DRAWINGS

The invention may be best understood by reading the disclosure with reference to the drawings, wherein.

DETAILED DESCRIPTION OF THE PREFERRED EMBODIMENTS

The preferred embodiments are disclosed below as applied to an amplifier implemented as an integrated circuit using specific combinations of npn and pnp bipolar junction transistors. Those skilled in the art will recognize that the principles taught in the embodiments can also be used in building integrated circuit embodiments using other transistor mixes, and with many different implementations for circuitry peripheral to the amplifier core.

Figure 2:
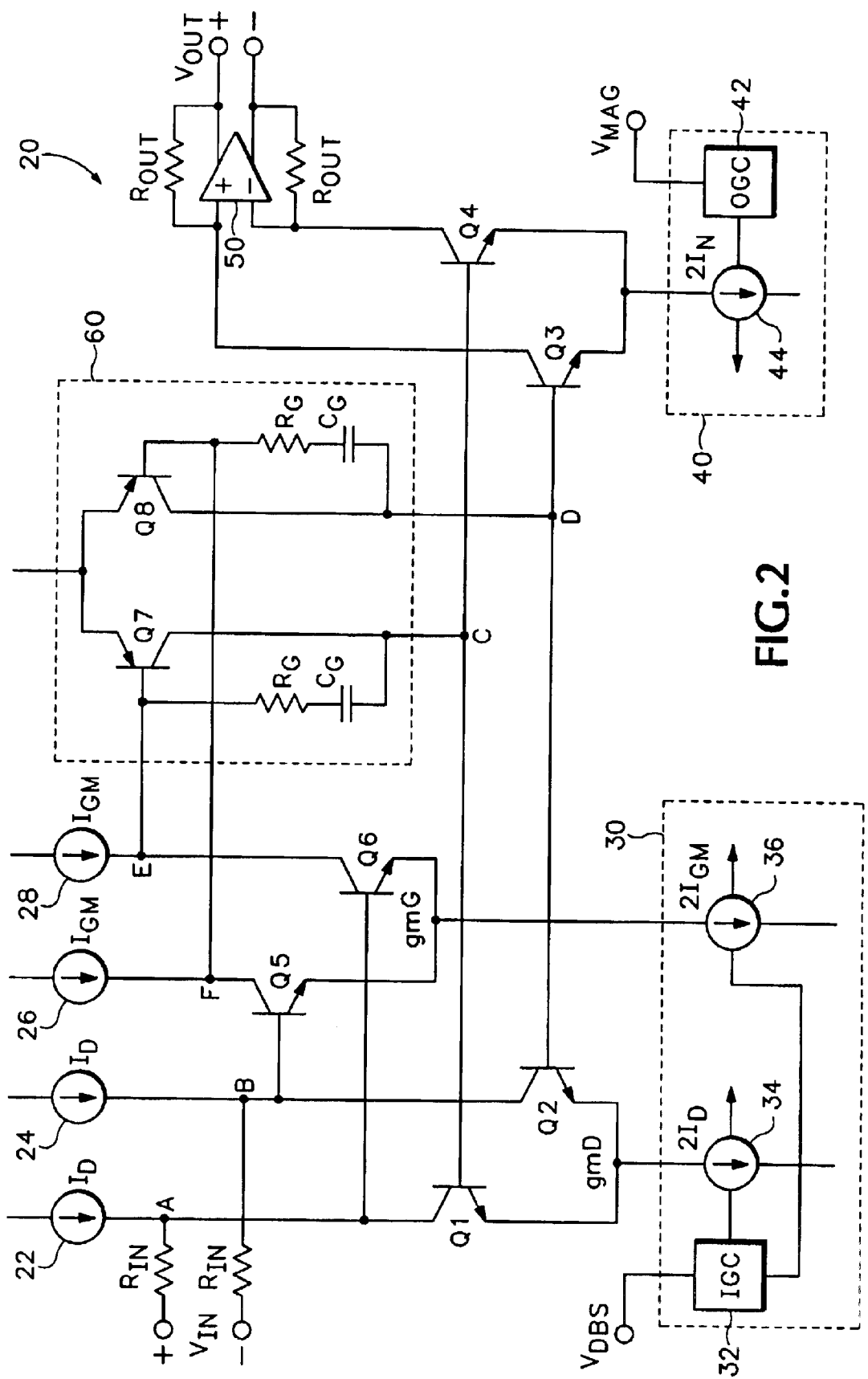
FIG. 2 contains a circuit diagram for a first amplifier according to an embodiment of the invention.

FIG. 2 shows an amplifier 20 according to a first embodiment of the invention. Four matched npn bipolar transistors are arranged as an input pair Q1, Q2 and an output pair Q3, Q4, with the bases of Q1 and Q4 connected and the bases of Q2 and Q3 connected. The emitters of Q1 and Q2 connect to a controllable input current source 34. The emitters of Q3 and Q4 connect to a controllable output current source 44.

A differential voltage input $V_{IN}$ is applied through identical input resistors $R_{IN}$ to the collectors of Q1 and Q2 (nodes A and B). Matched current source loads 22 and 24 supply collector current to the collectors of Q1 and Q2.

The collector currents of the output pair Q3, Q4 run to the inputs of a differential transimpedance amplifier 50 and to its matched feedback resistors $R_{OUT}$. A differential voltage output $V_{OUT}$ is produced at the output of amplifier 50.

A loop amplifier is coupled between the collectors of the input pair (nodes A and B) and the connected bases of the input and output pairs (nodes C and D). The loop amplifier comprises a gain pair of npn transistors Q5, Q6 and associated circuitry, and a Miller integrator 60.

The emitters of Q5 and Q6 connect to a controllable gain current source 36. The base of Q5 connects to node B, and the base of Q6 connects to node A. Matched current source loads 26 and 28 supply collector current to the collectors of Q5 and Q6.

The Miller integrator 60 completes the loop by coupling the collectors of Q6 and Q5 (nodes E and F, respectively) to nodes C and D. Because the design of Miller integrator 60 is less critical (other than symmetry issues, which will be discussed below), a simple implementation is shown but others may be used as well. Miller integrator 60 comprises a pair of pnp transistors Q7, Q8 with connected emitters. The base of Q7 connects to node E, and the base of Q8 connects to node F. The collector of Q7 drives node C, and the collector of Q8 drives node D. Two identical RC circuits, each comprising the serial combination of a resistor $R_G$ and a capacitor $C_G$, respectively connect the base to the collector for each of Q7 and Q8. In one embodiment, the corner frequency of the RC circuits is set at about 200 MHz.

An output gain-control (OGC) circuit 42 receives an output gain control voltage $V_{MAG}$, and uses $V_{MAG}$ to set current source 44 to an appropriate current level.

An input gain-control (IGC) circuit 32 receives an input gain control voltage $V_{DBS}$, and uses $V_{DBS}$ to set current source 34 to an appropriate current level. When IGC circuit 34 changes the current level of current source 34, it changes the current level of current source 36 inversely.

The function of the IGC circuit, and how it works with the loop amplifier to improve circuit performance, is an important part of this disclosure. One function of the loop amplifier is to minimize input distortion at nodes A and B due to the voltage difference that appears across nodes C and D during operation. For instance, a loop amplifier gain of a thousand would produce a 60-dB improvement compared to just connecting nodes A and C and nodes B and D. Although such a gain is possible in the abstract, other difficulties may arise in implementation. For instance, if amplifier 20 is to operate at hundreds of MHz, the loop amplifier would need a gain-bandwidth product on the order of hundreds of GHz. This is further complicated by the fact that the input pair tail current, and therefore the transconductance (gmD) of the input pair, may be varied over a large range, i.e. a factor of 300:1 for a 50-dB input-gain-adjustment range. Because $R_{IN}$*gmD appears in the feedback path as a load to the loop amplifier, the overall loop gain also varies with changing gmD. Thus not only should the loop amplifier have enormous gain bandwidth (for a high frequency, low-distortion application), it should also remain stable and maintain constant gain while a load in its feedback loop changes by a factor of 300 or more.

A solution to these problems lies in the inverse current relationship between $I_D$ and $I_{GM}$. The loop amplifier uses a gm cell with its own transconductance gmG. As the loop gain also depends on the value of gmG, constant loop gain can be achieved by holding the value gmD·gmG constant, while varying gmD as necessary for overall amplifier function. This requires that gmD and gmG vary inversely. Since transconductance is proportional to collector current, IGC circuit 32 can maintain constant loop gain by varying $I_{GM}$ inversely with $I_D$.

Figure 1:
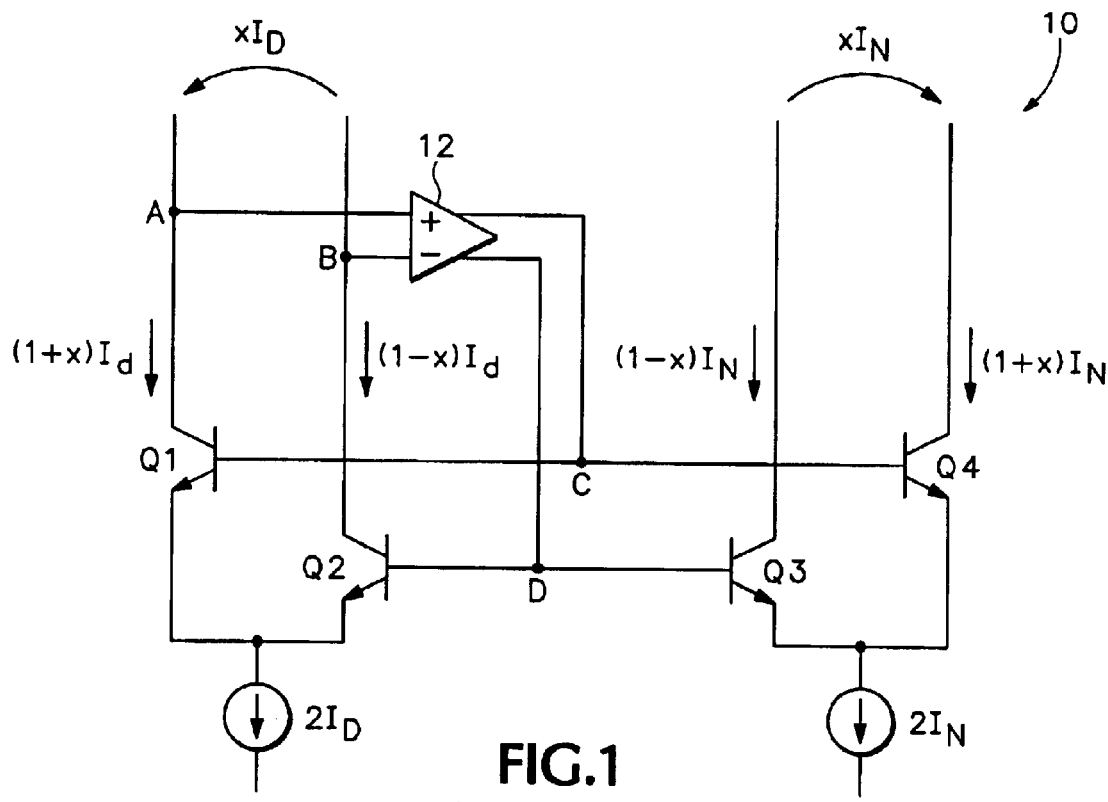
FIG. 1 contains a circuit diagram for a prior art translinear amplifier.
Figure 3:
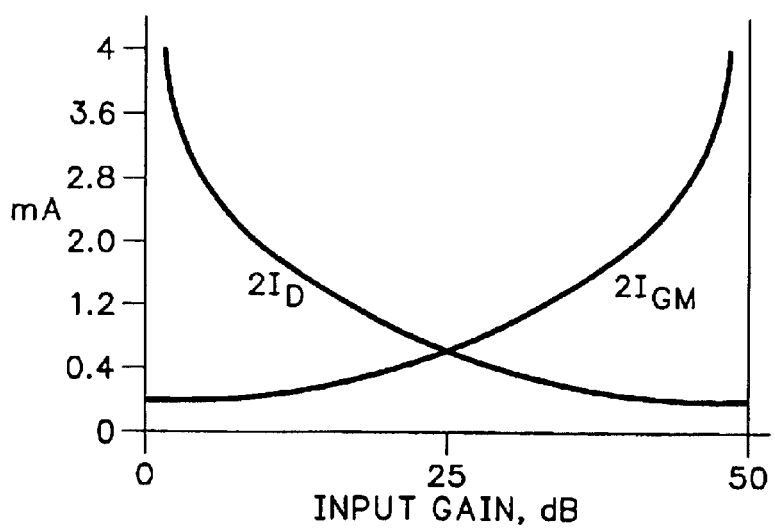
FIG. 3 shows an inverse exponential relationship between input pair tail current and gain pair tail current, as used in some embodiments of the invention.

In a preferred embodiment, $I_D$ is varied exponentially with changes in $V_{DBS}$. For instance, the input gain or basic gain $G_B$, in decibels, can be expressed as a linear function of $V_{DBS}$, $$G_B(dB)=V_{DBS}/30\ mV$$

with zero gain for an input $V_{DBS}=0$ V and 50 dB gain for an input $V_{DBS}=1.5$ V. $I_D$ is exponentially related to $V_{DBS}$, i.e.:

$$I_D=I_O e^{cV_{DBS}},$$

where $I_O$ is a reference current and c is a constant. $I_{GM}$ is inversely related to $I_D$:

$$I_{GM} = I_{SP}e^{(P-cV_{DBS})} = I_{SP}e^P e^{-cV_{DBS}} = \frac{I_{SP}I_O e^P}{I_D},$$

where $I_{SP}$ is a reference current and P is a constant. FIG. 3 illustrates an exemplary inverse relationship between $I_{GM}$ and $I_D$, for $I_O=I_{SP}$. Detailed circuitry for generating these currents will be illustrated shortly, after introduction of a more specific amplifier embodiment.

Figure 4:
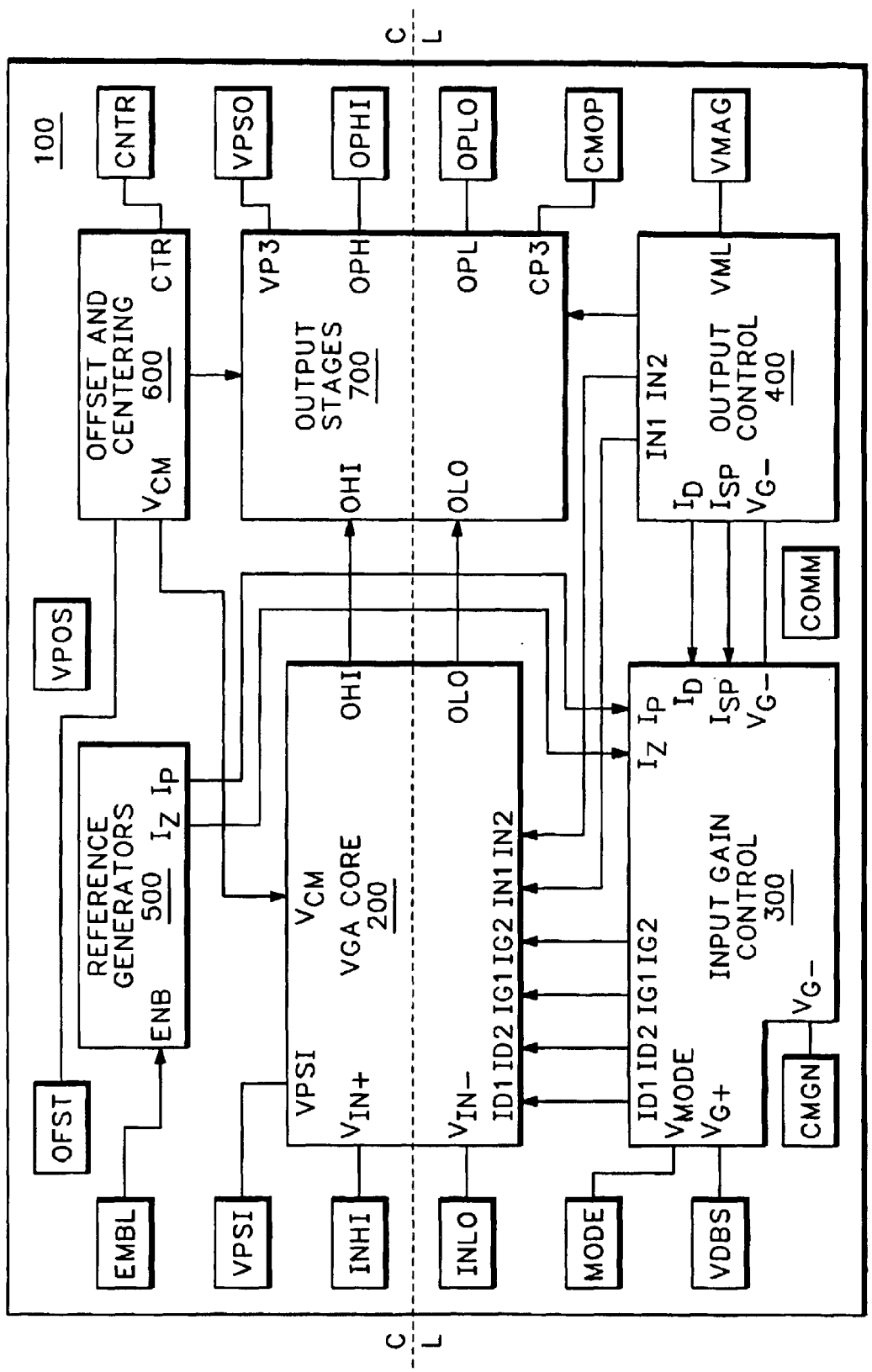
FIG. 4 shows a general circuit layout block diagram for a variable-gain amplifier according to an embodiment of the invention.

FIG. 4 illustrates the general layout for an integrated circuit amplifier 100 according to an embodiment of the invention. This amplifier contains six circuit modules and sixteen electrical bonding pads. Note the arrangement of the bonding pads and circuit modules: VGA core 200 and output stages 700 straddle the circuit centerline; the amplifier differential signal input pads (INHI and INLO) and output pads (OPHI and OPLO) are symmetrical about and near the circuit centerline; and the general pad layout is symmetrical about the centerline. VPOS and COMM (supply and ground) pads are located respectively at top and bottom of circuit 100, near the left-to-right center of the circuit. Wide supply buses extend from VPOS and COMM into the spaces between the six circuit modules, but are not shown in FIG. 4 for clarity. These layout precautions attempt to minimize thermal gradients across the core and output stages.

The general function provided at each bonding pad will now be described. Three positive supply pins are provided: VPSI supports the input circuitry; VPSO supports the output circuitry; and VPOS supports general biasing circuitry. The use of separate pins allows for external decoupling circuitry (e.g., RC circuits, not shown) that helps isolate the input circuitry and output circuitry from perturbations in the positive supply (and each other). Three common supply pins are provided as well: COMM, which is the ground reference for most of the device; CMOP, which is the common reference for the output stage; and CMGN, which is the common reference for the gain inputs. Normally, all three will be connected to ground, but the three-pin flexibility exists to, e.g., accommodate gain inputs that cannot go all the way to ground and outputs that run off of a negative as well as a positive supply.

ENBL activates the circuit when set at or near VPOS by activating the reference generator circuitry 500. VDBS, along with CMGN, provides the linear-in-dB gain input. MODE, when left unconnected or set high, provides the normal gain-operating mode, where increases at VDBS correspond to increases in gain. When MODE is set low, the operating mode is reversed, i.e., increases at VDBS correspond to decreases in gain. VMAG, along with CMGN, provides the linear-in-magnitude gain input. VMAG may be left unconnected, biased off of a stable supply voltage, or connected to an active control signal or multiplier input. Finally, OFST and CNTR can be used to tailor the circuit output: OFST can be connected to an external capacitor to set a high-pass corner frequency in the signal path; CNTR can be used to move the common-mode level at OPHI and OPLO from its nominal position at half of the supply voltage.

The general function of each circuit module will now be described. VGA core 200 contains the differential input impedance network and input biasing circuitry, the input pair and its collector loads, the loop amplifier, and the output pair. Input gain control module 300 responds to the linear-in-dB gain input to provide tail currents to the input pair and loop amplifier. Output control module 400 responds to the linear-in-magnitude gain input to provide tail currents to the output pair; this module also provides several reference currents used by input gain control module 300.

Reference generators 500 provide precise reference currents and reference voltages used by other modules (two such currents, $I_Z$ and $I_P$, are shown, but others not necessary for the understanding of the invention are generated as well). Offset and centering module 600 provides the offset and centering functions described in the preceding paragraph, and output stages 700 provide the output transimpedance amplification. As detailed understanding of modules 500, 600, and 700 is not necessary for understanding the invention, further description of these blocks is omitted.

Figure 5A:
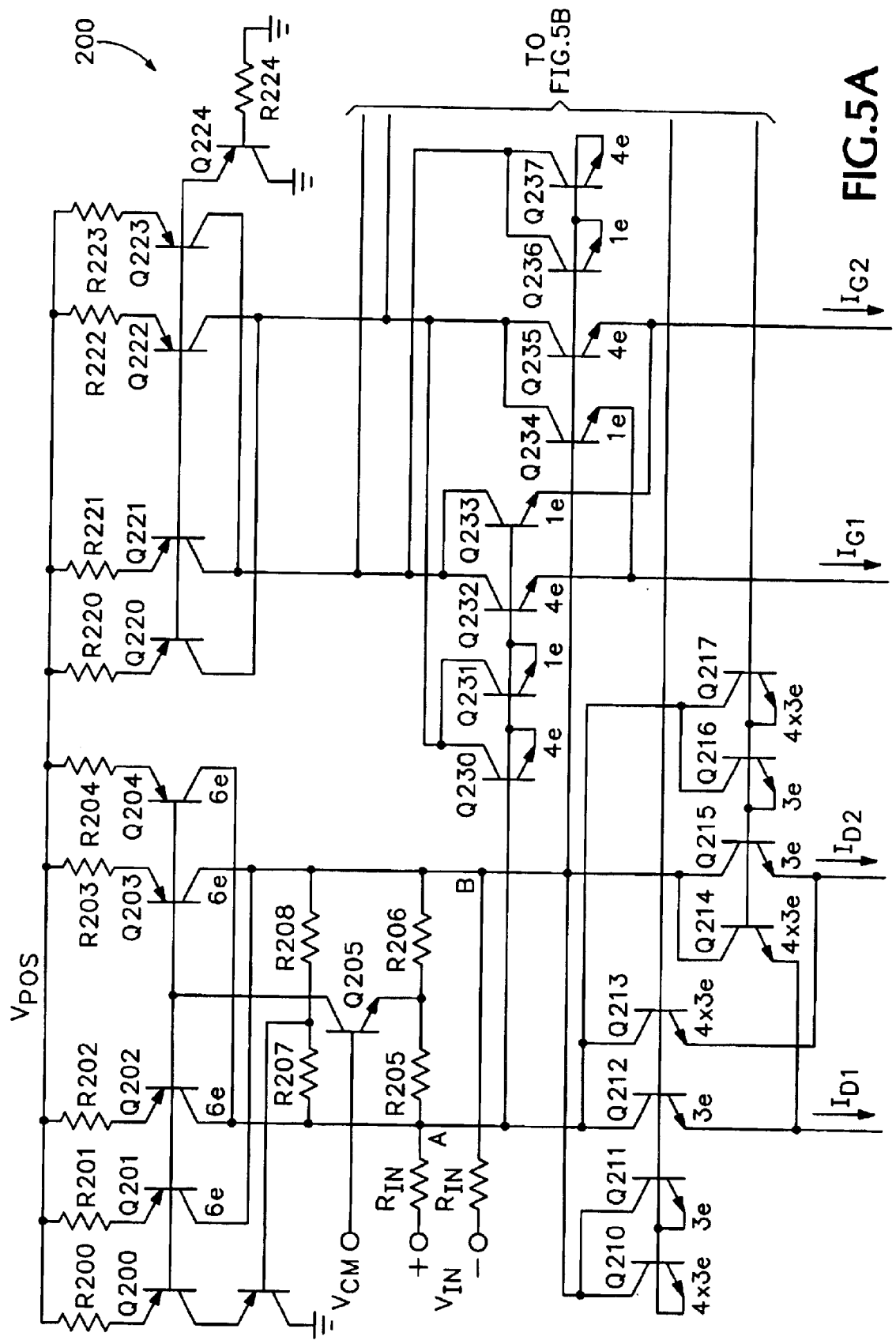
FIG. 5 contains a circuit diagram for the VGA core shown in FIG. 4.
Figure 5B:
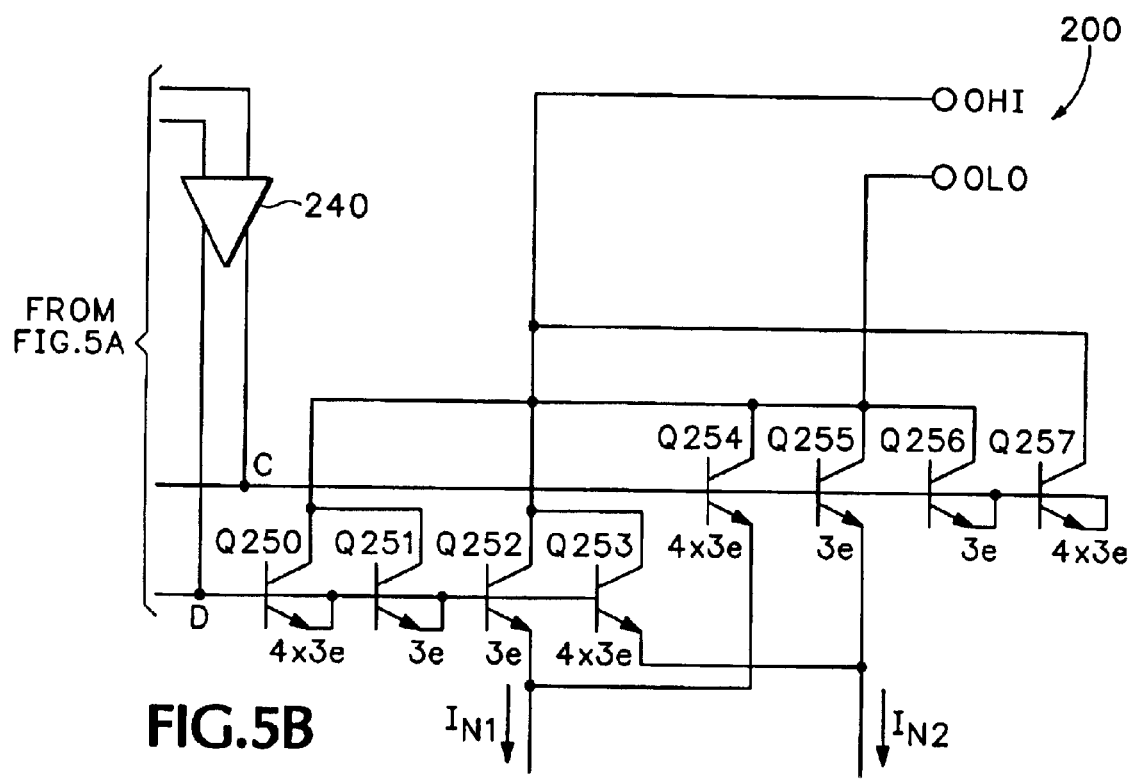

FIG. 5 shows, in great detail, the critical components of VGA core 200 in this embodiment. A specific configuration for the input pair, output pair, and gain pair will be described first, followed by a short description of the differential input impedance network and a description of the collector load circuits for the input pair and the gain pair.

As was stated earlier, to minimize distortion to an acceptable level at the circuit input could require, for some signals, loop amplifier gain-bandwidth products in the hundreds of GHz. But the emphasis in the preceding description has focused on constant gain, and it is conceded that achieving a gain-bandwidth product in the hundreds of GHz in the amplifier's closed loop is likely an impossible task.

The solution to this problem lies in the transistor "pair" configuration shown in FIG. 5. The primary purpose of having a high gain in the loop amplifier is to divide down the non-linearity in the ΔV appearing across nodes C and D, so that the inherent non-linearity in that ΔV appears as a much smaller non-linearity at nodes A and B. Since the desired high gain may not be achievable, this embodiment skirts the issue by improving the linearity of the input pair.

In FIG. 5, four transistors Q212, Q213, Q214, and Q215 serve as the input pair in an arrangement known as a multi-tanh parallel doublet. Q212 and Q213 have their collectors joined at node A, and share a common base connection to node C. Q214 and Q215 have their collectors joined at node B, and share a common base connection to node D. The emitters, however, are cross-coupled: Q212 and Q214 share tail current $I_{D1}$; Q213 and Q215 share tail current $I_{D2}$. The other important feature of this configuration is that Q213 and Q214 are a different size than Q212 and Q215 (in this example, Q212 and Q215 each have three equal-area emitters, and Q213 and Q214 each have twelve equal-area emitters, all of these emitters identical). The multi-tanh parallel doublet is linear from its voltage input to its current output. But this is true in the opposite direction as well: linear collector currents at nodes A and B result in a linear ΔV at nodes C and D.

It has been observed that other benefits can arise from the multi-tanh doublet configuration. For instance, this configuration has reduced sensitivity to random emitter area mismatches observed from device to device, which otherwise would give rise to parabolic distortion. Also, non-linearity due to differences in input pair tail current and output pair tail current is reduced. This is a real benefit in the circuit of FIG. 2, where the ratio of the input to output tail current could vary over a range of 30,000, depending on gain settings.

An identical multi-tanh doublet configuration is used for the output pair (Q252, Q253, Q254, Q255). And although the transistors are smaller, a multi-tanh doublet configuration with the same emitter area ratios is used for the gain pair.

Figure 8:
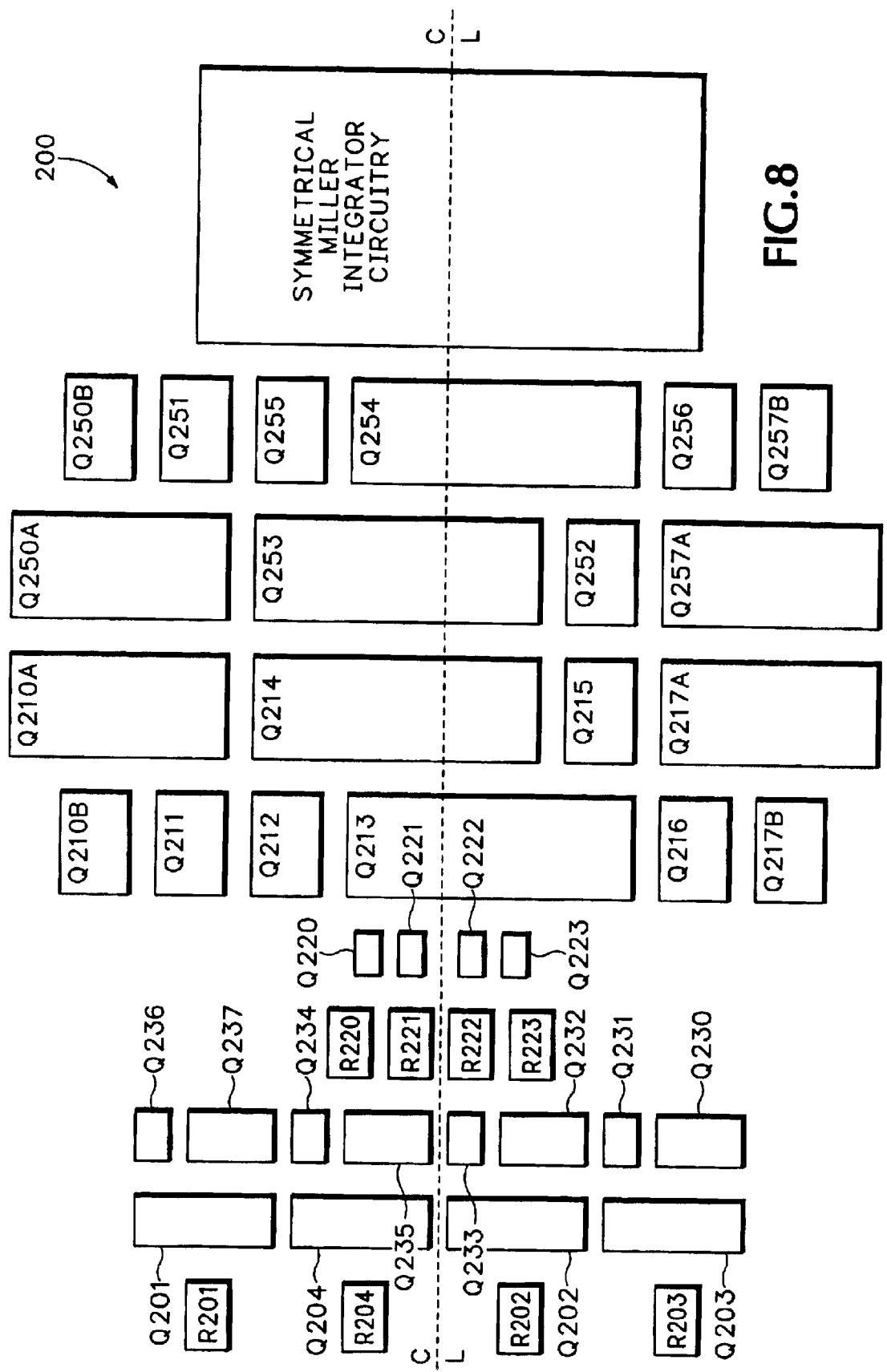
FIG. 8 shows component layout for symmetrical components of the VGA core shown in FIG. 5.

The input pair and output pair transistors are preferably very large compared to other transistors in the circuit (see FIG. 8 and compare, e.g., the area of Q212 and Q213 with the area of Q202 and Q204 that share the same current path). One reason for making the input pair and output pair transistors large is to reduce their ohmic resistance, again to remove a source of distortion. A second reason to make these transistors large is to allow accurate matching, which may be difficult to achieve when the transistors are of smaller size. As can be appreciated by examining FIG. 4, which shows a circuit layout approximately to scale, and FIG. 8, which shows the overall layout of symmetrical components in VGA core 200, the input and output pair transistors consume a significant fraction of the overall chip area.

Unfortunately, the use of large transistors raises other concerns besides the consumption of chip area. One such concern is collector-junction capacitance ($C_{JC}$), particularly for the input pair when the tail currents $I_{D1}$ and $I_{D2}$ are at the low end of their range. Under low-current conditions, $C_{JC}$ tends to dominate the transistors' response. To counteract this behavior, additional transistors are added to each critical pair (the input pair, output pair, and gain pair) to provide $C_{JC}$ cancellation. Taking the input pair again as exemplary, two $C_{JC}$-cancellation transistors Q210 and Q211 share a common base connection with Q212 and Q213, and a common collector connection with Q214 and Q215. Two other $C_{JC}$-cancellation transistors Q216 and Q217 are cross connected the opposite way (sharing a common base connection with Q214 and Q215 and a common collector connection with Q212 and Q213). All four $C_{JC}$-cancellation transistors have their bases shorted to their emitters. These transistors are each size-matched to a corresponding input pair transistor, i.e., Q211 and Q212 are size-matched, Q210 and Q213 are size-matched, etc.

The differential input impedance network comprises the two matched input resistors $R_{IN}$ and circuitry for setting the common-mode voltage at nodes A and B. One biasing path comprises a biasing resistor R200 connected at one end to $V_{POS}$, and two pnp transistors Q200 and Q206 cascoded between the opposite end of R200 and ground. Transistor Q200 shares a base connection with the input pair load transistors. Transistor Q206 has its base connected to both nodes A and B through two identical resistors R207 and R208, such that the base of Q206 is biased at the average of the voltage at nodes A and B. Base current to Q200 and the input pair load transistors is provided by npn transistor Q205, which has its emitter connected to both nodes A and B through two identical resistors R205 and R206. The base of Q205 is controlled by common-mode voltage $V_{CM}$, supplied by offset and centering module 600 (FIG. 4). Note that the resistance values of the common-mode-biasing network are, in this embodiment, significantly larger than those used in the input pair load transistors (exemplary values are 10 kΩ for R200, 20 kΩ for R207 and R208, 8 kΩ for R205 and R206, and 240 Ω for R201, R202, R203, and R204).

Four input pair load transistors Q201, Q202, Q203, and Q204 are connected in a crossed relationship, i.e., the collectors of Q202 and Q204 connect to node A and the collectors of Q201 and Q203 connect to node B. The emitter of each input pair load transistor is connected to VPOS through one of four matched resistors. A similar load circuit is used for the gain pair.

Figure 6:
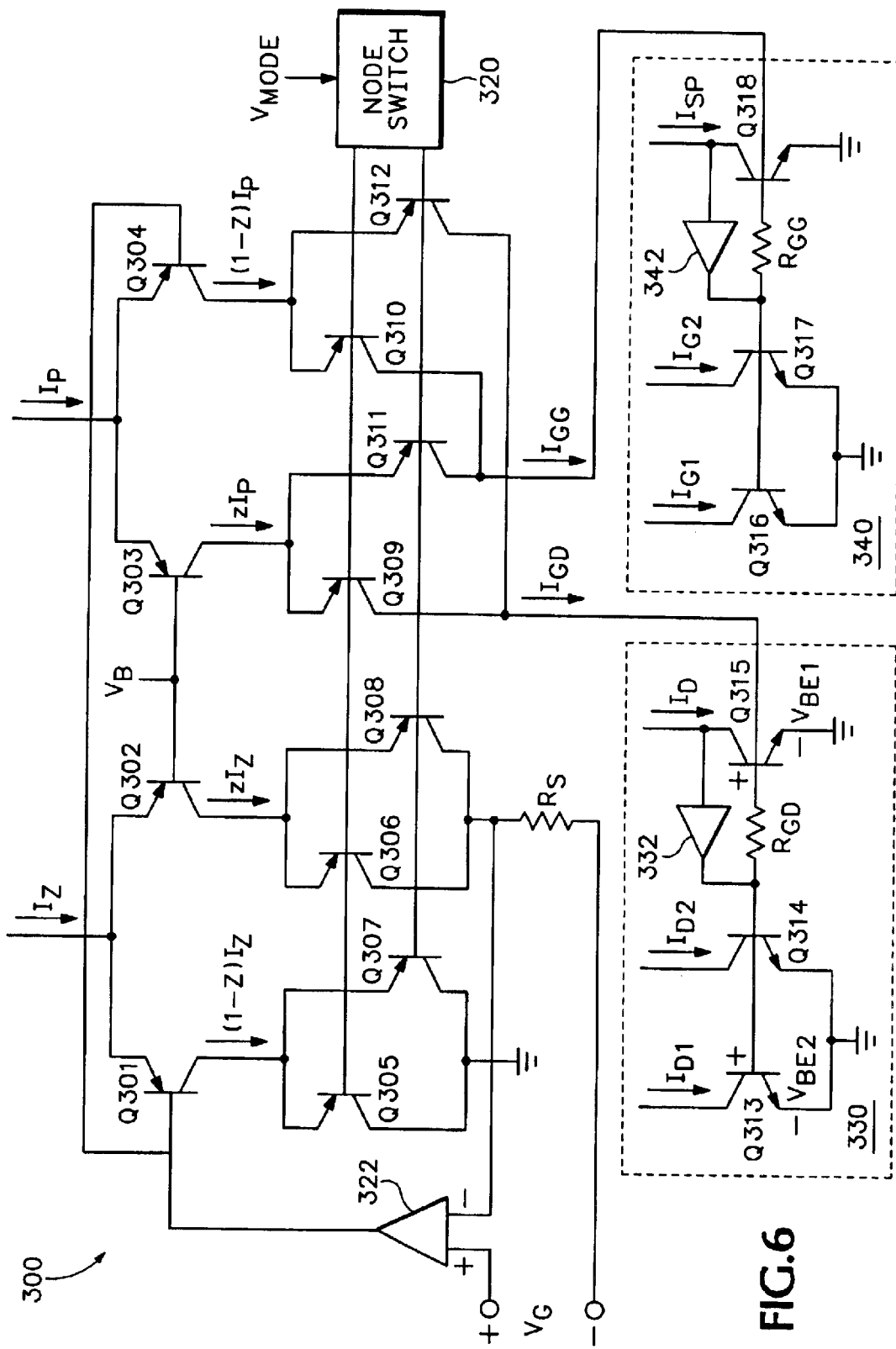
FIG. 6 illustrates a circuit diagram for the input gain control module shown in FIG. 4.

FIG. 6 shows detailed circuitry for input gain control module 300. The linear-in-dB gain input is applied across terminals $V_G$. $V_{G+}$ connects to the positive terminal of an amplifier 322, and $V_{G-}$ connects to the negative terminal of amplifier 322 through a resistor $R_S$. A feedback path, to be described next, connects the output of amplifier 322 back to $R_S$, in essence forcing a current through $R_S$ equal to $V_G/R_S$.

A pnp differential pair Q301, Q302 splits a tail current $I_Z$, which is a temperature-stable reference current. The Q301 collector current can be expressed as $(1-z)I_Z$, and the corresponding Q302 collector current as $zI_Z$, where $0<z<1$. The base of Q302 is connected to a stable reference voltage $V_B$. The output of amplifier 322 connects to the base of Q301, and $R_S$ receives the Q302 collector current, providing the feedback path for amplifier 322. Thus z is a function of $V_G$:

$$z = \frac{V_G}{I_Z R_S}.$$

In a preferred embodiment, $I_Z$ and $R_S$ are related to the linear-in-dB slope desired for the circuit.

Differential pair Q301, Q302 connect to a matched pnp differential pair Q303, Q304. Q302 and Q303 share a common base connection; Q301 and Q304 share a common base connection. Thus the current ratio $(1-z)$:$z$ at pair Q301, Q302 is reflected at Q304, Q303.

The Q303, Q304 tail current $I_P$ is a proportional-to-absolute-temperature (PTAT) reference current. Thus Q303 and Q304 provide two PTAT control currents with a negative but direct relationship: $zI_P$ and $(1-z)I_P$.

Although not necessary for basic circuit operation, input gain control module 300 also contains circuitry to provide two gain modes, a normal mode which increases gain for increasing $V_G$, and an inverse mode which decreases gain for increasing $V_G$. This circuitry comprises a mode switch 320 and four pnp transistors Q309, Q310, Q311, and Q312 controlled by mode switch 320. These four transistors route one of PTAT control currents $zI_P$ and $(1-z)I_P$ as denominator control current $I_{GD}$, and the other of the PTAT control currents as gain pair control current $I_{GG}$. Thus in normal mode, Q311 and Q312 are active such that $I_{GD}=zI_P$ and $I_{GG}=(1-z)I_P$. In inverse mode, Q309 and Q310 are active such that $I_{GD}=(1-z)I_P$ and $I_{GG}=zI_P$.

Preferably, the $I_P$ mode-switch transistors have analogs Q305, Q306, Q307, Q308 in the $I_Z$ collector paths, also controlled by mode switch 320. Since the Q301, Q302 collector currents never switch polarity, however, these transistors do not cross-connect, and actually perform no switching. They do, however, improve the linearity of the gain current control circuit.

Control currents $I_{GD}$ and $I_{GG}$ are supplied to two exponential current generators 330 and 340. Current generator 330 comprises three emitter-grounded transistors Q313, Q314, Q315, a scaling resistor $R_{GD}$, and a feedback amplifier 332. The Q313 and Q314 collector currents sink input pair tail currents $I_{D1}$ and $I_{D2}$. The Q315 collector current is a temperature-stable reference current $I_D$. Control current $I_{GD}$ is supplied to the base of Q315, and to the bases of Q313 and Q314 through resistor $R_{GD}$. Amplifier 332 is referenced to the collector of Q315, and includes $R_{GD}$ in its feedback loop. Thus amplifier 332 does whatever it must to maintain the Q315 base-emitter voltage $V_{BE1}$ at the proper voltage for fixed collector current $I_D$. This means that $I_{GD}$ must flow through $R_{GD}$, raising the Q313/Q314 base-emitter voltage $V_{BE2}$ above $V_{BE1}$ by a voltage $I_{GD}R_{GD}$. Accordingly, tail current $I_{D1}$ (as well as $I_{D2}$) is set based on both $I_D$ and $V_G$ (through $I_{GD}=zI_P$):

$$I_D = I_{CE} e^{\frac{V_{BE1}}{KT/q}}$$

$$I_{D1} = I_{CS} e^{\frac{V_{BE2}}{KT/q}} = I_{CS} e^{\frac{(V_{BE1}+I_{GD}R_{GD})}{KT/q}} = I_{CS} e^{\frac{V_{BE1}}{KT/q}} e^{\frac{I_{GD}R_{GD}}{KT/q}}$$

$$= I_D e^{\frac{R_{GD} I_P V_G}{R_S I_Z KT/q}},$$

where $I_{CS}$ is a constant based on transistor size, K is the Boltzmann constant, q is the electron charge, and T is absolute temperature. Note that since $I_P$ is PTAT, $I_P T$ is a constant and therefore $I_{D1}$ is stable with temperature. Thus current source 330 provides a tail current that is stable with temperature but exponentially proportional to input gain voltage $V_G$, or in other words, linear-in-dB.

The transconductance of the input pair is still temperature-dependent, even though tail currents $I_{D1}$ and $I_{D2}$ have been formed with zero temperature variability. Thus despite attempts to maintain a constant feedback loop gain using the controlled gain pair, those attempts would be thwarted without something to compensate for the transconductance change at the input pair. The solution used in this embodiment is to insert temperature compensation for both the input pair gm and the gain pair gm into the gain pair tail current. To accomplish this, a linear-in-dB circuit 340 uses a reference current $I_{SP}$ that is proportional to absolute temperature squared, i.e., $I_{SP}=I_U \times T^2$, where $I_U$ is constant with temperature. Given that control current $I_{GG}=I_P-I_{GD}$, and that exponential current generator 340 is similar to generator 330 (e.g., $R_{GG}=R_{GD}$), gain pair tail current $I_{G1}$ (as well as $I_{G2}$) reduces to:

$$I_{G1} = (I_U \cdot T^2) e^{\frac{I_{GG} R_{GG}}{KT/q}} = (I_U \cdot T^2) e^{\frac{(I_P - I_{GD}) R_{GD}}{KT/q}}$$

$$= k_0 (I_U \cdot T^2) e^{\frac{-I_{GD} R_{GD}}{KT/q}},$$

where $$k_0 = e^{\frac{I_P R_{GD}}{KT/q}}.$$

And given that the loop gain A is proportional to the transconductance of the input pair gmD and the transconductance of the gain pair gmG, the following holds:

$$A \propto gmD \cdot gmG$$

$$gmD \cdot gmG = \left(\frac{I_{D1}}{KT/q}\right)\left(\frac{I_{G1}}{KT/q}\right)$$

$$= \left(\frac{I_D e^{\frac{I_{GD}R_{GD}}{KT/q}}}{KT/q}\right)\left(\frac{k_0(I_U \cdot T^2)e^{\frac{-I_{GD}R_{GD}}{KT/q}}}{KT/q}\right) = \frac{k_0 I_D I_U}{(K/q)^2}$$

This remarkable result illustrates that despite an exponentially-variable input pair tail current that is held temperature stable, and regardless of temperature and input gain level, the loop gain remains constant. As a final note, the reference current $I_{SP}$, which is proportional to $T^2$, can be generated in many ways; in one embodiment $I_{SP}$ is just approximated over the operating temperature range using a pnp transistor connected at its emitter to a positive supply through a first resistor. The transistor's base connects to a stable reference voltage, and also to its emitter through a second resistor, the two resistors having a ratio of 1:2.1.

Figure 7:
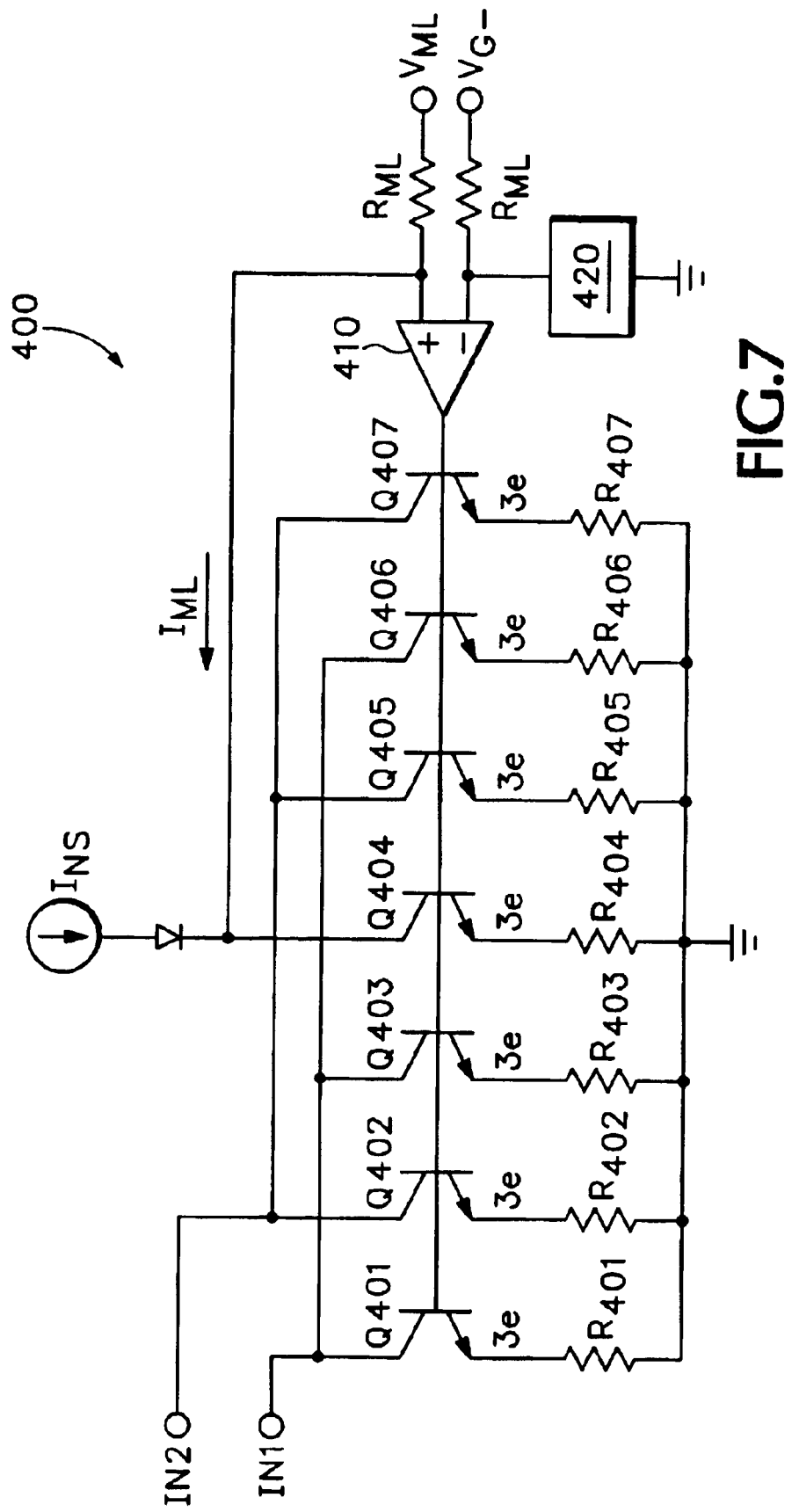
FIG. 7 illustrates a circuit diagram for the output gain function of the output control module shown in FIG. 4.

FIG. 7 shows the section of the output control module 400 that generates the output pair tail currents. Seven transistors Q401 to Q407 share a common base connection driven by amplifier 410, with Q401, Q402, Q403, Q405, Q406, and Q407 identical. Each transistor connects to ground through a corresponding emitter resistor R401 to R407, with R401, R402, R403, R405, R406, and R407 identical. The collectors of Q401, Q403, and Q406 tie together to create output pair tail current $I_{N1}$; the collectors of Q402, Q405, and Q407 tie together to create output pair tail current $I_{N2}$ (the use of multiple interleaved transistors decreases sensitivity to process-related mismatches between the transistors). The center transistor, Q404, sets the output pair tail currents based on a sum of two currents supplied to its collector: a temperature-stable 100-$\mu$A reference current $I_{NS}$, and a magnitude-gain-setting current $I_{ML}$.

Bias-setting circuit 420 sets the input voltage to amplifier 410 to 500 mV. Magnitude-gain-setting current $I_{ML}$ is set by application of a linear-in-magnitude control voltage $V_{ML}$ to external circuit connection VMAG. A 5-k$\Omega$ resistor $R_{ML}$ connects $V_{ML}$ to the input of amplifier 410, and to the collector of Q404. Thus if $V_{ML}$ decreases to 5 mV, the $V_{ML}$ input steals 99% of current $I_{NS}$ and the gain is lowered by 40 dB. On the other hand, if $V_{ML}$ increases to 5 V, $I_{ML}+I_{NS}=1$ mA, and the gain is increases by 20 dB. This scheme allows a 60-dB linear adjustment in amplifier gain. Coupled with the 60 dB of linear-in-dB scaling available at the input, a combined adjustable gain span of 110 dB is available.

FIG. 8 shows, approximately to scale, the relative size and positioning of major "symmetrical" components of VGA core 200. Such components are generally those that, because of differential signal processing, should be free of the effects of non-uniform wafer processing, temperature gradients during operation, etc.

Figure 9:
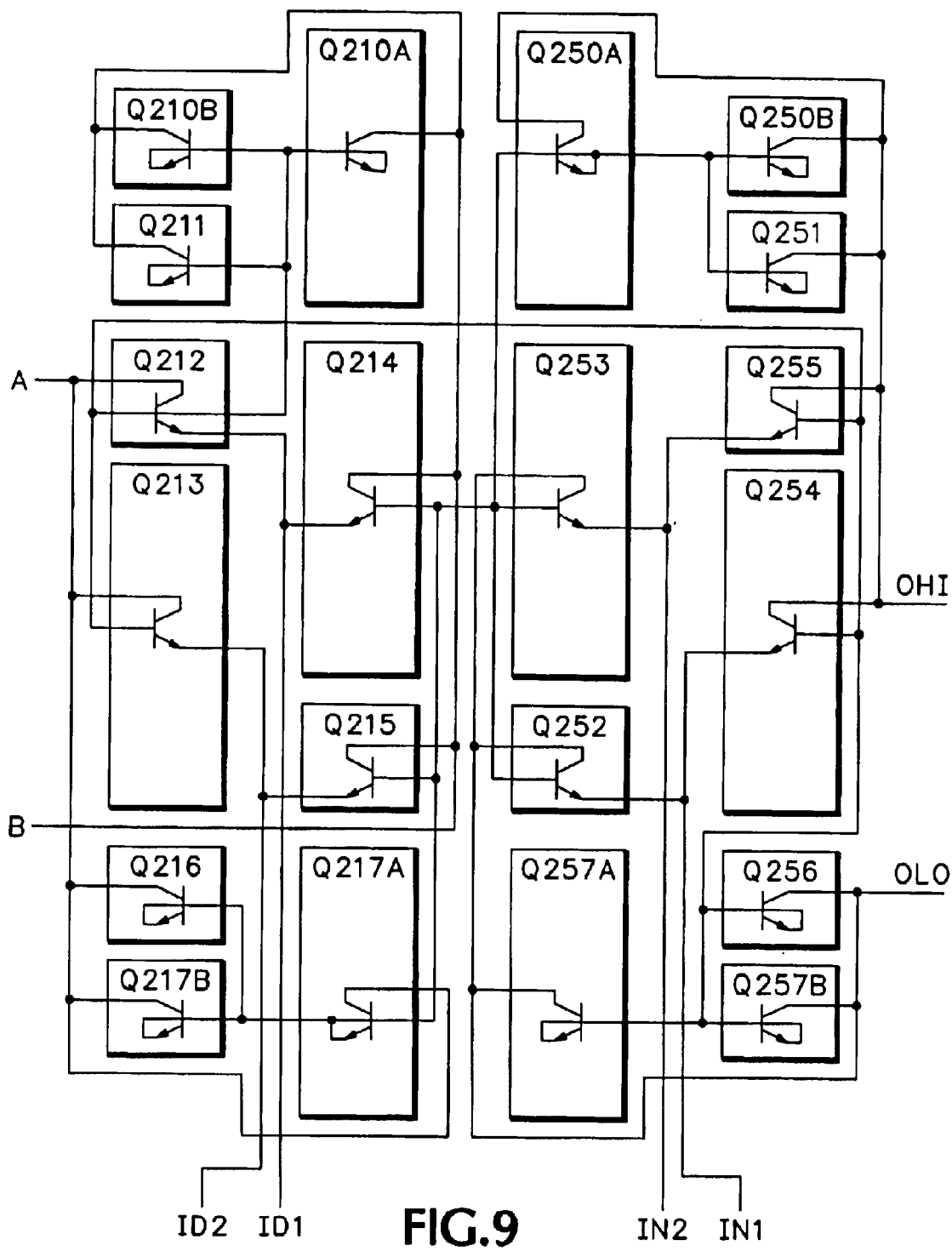
FIG. 9 illustrates circuit connections for the input and output pair transistors shown in FIG. 8.

Arguably, the most crucial set of components are the input and output pairs. As shown in FIG. 8, the transistors in these pairs straddle the chip centerline, with alternating up/down orientation (e.g., Q212 is above Q213 and above the circuit centerline; Q215 is below Q214 and below the centerline; the shifts from the centerline are equal for Q212 and Q215, and for Q213 and Q214). The gain pair transistors, input pair loads, gain pair loads, and Miller integrator circuitry also straddle the chip centerline and are largely symmetric. Where transistors with shorted base-emitter junctions are added for CJC cancellation, those transistors are placed outboard of the functional transistors—this both simplifies signal routing and allows the active input and output pair transistors to be placed closer together, increasing the probability that they match each other well. FIG. 9 demonstrates one exemplary signal routing layout for the input and output pair transistors.

Many differing implementations for elements of the disclosed embodiments are possible. It is understood that specific values for bias currents, voltages, resistance values, gains, transistor sizes and size ratios, etc., will depend on a particular application, and the selection of such is within the ordinary skill in the art. Many disclosed features, such as the ability to control gain both at the input pair and the output pair, or the ability to offset the common connection or common-mode output voltage, are attractive features but are not necessary to the operation of the invention. Although differential inputs and outputs are shown for the VGA embodiments, those skilled in the art recognize how to connect single-ended signals to the input and/or output of such a circuit. These and other such modifications are intended to fall within the scope of the claims.

What is claimed is:

1. A variable-gain amplifier (VGA) comprising:
   four first matched bipolar transistors arranged as an input pair and an output pair, each transistor connected at its base to the base of a corresponding transistor in the other pair;
   an input-current source connected to the emitters of the input pair;
   an output-current source connected to the emitters of the output pair;
   a loop amplifier coupled between the collectors of the input pair and the connected bases of the input and output pairs, the loop amplifier comprising a gain transistor pair, each transistor in the gain pair having a base coupled to a corresponding input pair transistor collector;
   a controllable gain-current source connected to the emitters of the gain pair; and
   a gain-control circuit coupled to the gain-current source, the gain-control circuit adjusting the gain-current-source current such that the product of the input pair transconductance and the gain pair transconductance remains approximately constant.

2. The variable-gain amplifier of claim 1, wherein the gain-control circuit drives the input-current source and gain-current source to produce inversely related exponential currents.

3. The variable-gain amplifier of claim 2, the gain-control circuit comprising an external voltage interface, the gain-control circuit scaling VGA gain linearly in decibels as a function of the voltage $V_G$ applied at the external voltage interface.

4. The variable-gain amplifier of claim 3, the gain-control circuit splitting a reference current $I_P$ into two control currents $I_{GD}$ and $I_{GG}$ such that each varies linearly with $V_G$, but opposite each other, control current $I_{GD}$ controlling the input-current source and control current $I_{GG}$ controlling the gain-current source, wherein the input-current and gain-current sources each produce an output current that varies exponentially with control current.

5. The variable-gain amplifier of claim 4, the gain-control circuit comprising:
   a gain-reference transistor pair sharing a temperature-stable tail current $I_Z$;
   a current-source-reference transistor pair sharing reference current $I_P$ as a tail current, wherein $I_P$ is proportional to absolute temperature, the gain control voltage used to shift current in the gain-reference pair, the gain-reference pair base-connected to the current source-reference pair such that the current ratio at the gain-reference pair is reflected at the current source-reference pair; and a gain-voltage amplifier that shifts a fraction z of tail current $I_Z$ to one of the gain-reference transistors, the fraction z varying linearly with $V_G$.

6. The variable-gain amplifier of claim 4, the gain-control circuit comprising a mode switch to allow gain to either increase or decrease with increasing $V_G$, the mode switch operating to swap $I_{GD}$ and $I_{GG}$ in order to switch modes.

7. The variable-gain amplifier of claim 4, wherein the input-current source produces a temperature-stable tail current for the input pair, the tail current proportional to $I_D e^{I_{GG}/T}$, where T is absolute temperature, $I_D$ is temperature-stable, and $I_{GG}$ varies proportional to absolute temperature.

8. The variable-gain amplifier of claim 7, wherein the gain-current source produces a tail current for the gain pair that is approximately proportional to the square of absolute temperature, the tail current proportional to $I_{SP} e^{-I_{GG}/T}$, where $I_{SP}$ varies approximately with the square of absolute temperature.

9. The variable-gain amplifier of claim 3, further comprising a second external voltage interface to an output-gain-control circuit, the output-gain-control circuit scaling amplifier gain linearly in magnitude as a function of the voltage $V_{ML}$ applied to the second external voltage interface by varying the output pair tail current produced by the output current source linearly with $V_{ML}$.

10. The variable-gain amplifier of claim 9, wherein the second external voltage interface is referenced to a bias voltage so as to set a default output gain when the second external voltage interface is left unconnected, and such that a voltage $V_{ML}$ less than the bias voltage decreases the output gain below the default output gain and a voltage $V_{ML}$ greater than the bias voltage increases the output gain above the default output gain.

11. The variable-gain amplifier of claim 1, wherein the loop amplifier further comprises a Miller integrator coupled between the collectors of the gain pair and the connected bases of the input and output pairs.

12. The variable-gain amplifier of claim 1, wherein the input-current source produces two matched input tail currents and the output-current source produces two matched output tail currents, one tail current for each of the four first matched bipolar transistors, the amplifier further comprising four second matched bipolar transistors, each sharing a common base and collector with a corresponding first matched bipolar transistor, each of the second transistors having its emitter connected to the matched tail current opposite that serving the corresponding first matched bipolar transistor.

13. The variable-gain amplifier of claim 12, wherein the four first transistors all have a first equal emitter area and the four second transistors all have a second equal emitter area different from the first size.

14. The variable-gain amplifier of claim 13, wherein the ratio of the first emitter area to the second emitter area is a ratio of two integers, each emitter implemented as an integer number of common-sized connected emitter regions.

15. The variable-gain amplifier of claim 12, further comprising eight collector-junction-capacitance (CJC)-cancellation transistors, each having its base-emitter junction shorted, each sharing a base connection with a corresponding one of the first and second bipolar transistors and matched in size to that corresponding transistor, each CJC-cancellation transistor collector cross-coupled to the opposite collector in the same pair as its corresponding transistor.

16. The variable-gain amplifier of claim 12, further comprising a two-terminal differential voltage input, each terminal coupled to a corresponding input pair collector by one of two matched resistors.

17. An integrated circuit comprising the variable gain amplifier of claim 1, the input pair and output pair transistors located substantially along a centerline of the integrated circuit and adjacent each other.

18. The integrated circuit of claim 17, substantially rectangular and comprising a number of bonding pads located along the circuit periphery, wherein bonding pad locations along each circuit edge are substantially mirrored along the opposite circuit edge.

19. A method of amplifying an input signal, the method comprising:

applying the signal as a differential current to the collectors of a first transistor pair having a first tail current;

mirroring the current densities in the first transistor pair to a second transistor pair having a second tail current by connecting the base of each transistor in the first pair to the base of a corresponding transistor in the second pair;

driving the bases of the transistor pairs from a loop amplifier taking its input at the collectors of the first transistor pair;

adjusting the drive amplifier gain inversely proportional to changes in the transconductance of the first transistor pair, such that a loop gain for the drive amplifier remains substantially constant; and detecting an amplified signal as a differential current at the collectors of the second transistor pair.

20. The method of claim 19, further comprising adjusting the first tail current in response to a gain-setting signal.

21. The method of claim 20, wherein adjusting the first tail current comprises varying the first tail current exponentially for a linear change in the gain-setting signal.

22. The method of claim 21, wherein varying the first tail current exponentially and adjusting the drive amplifier gain inversely proportional comprises:

dividing a reference current into complementary first and second control currents;

applying the first control current as a control signal to a first exponential current generator that supplies the first tail current; and applying the second control current as a control signal to a second exponential current generator that supplies a tail current to a differential current amplifier stage of the drive amplifier.

23. The method of claim 22, further comprising referencing the first exponential current generator to a temperature-stable base current, and referencing the second exponential current generator to a base current that varies proportional to the square of absolute temperature.

24. The method of claim 22, wherein varying the first tail current exponentially and adjusting the drive amplifier gain inversely proportional further comprises determining the division of the reference current by:

supplying a zero-temperature-coefficient gain-reference current;

steering a first portion of the gain-reference current to a first current branch by driving the current in that current branch proportional to an input voltage;

steering the remaining portion of the gain-reference current to a second current branch; and mirroring the division of gain-reference current between the first and second current branches to an equivalent division of the reference current between the first and second control currents.

25. The method of claim 22, further comprising accepting a mode signal, and swapping the first and second control currents when the mode signal is asserted, such that the first tail current decreases for a positive change in gain-setting signal in one mode, and the first tail current decreases for a positive change in gain-setting signal in another mode.

26. The method of claim 22, further comprising supplying a linear-in-magnitude control signal to a reference generator, and varying the second tail current proportional to the linear-in-magnitude control signal.

* * * * *

UNITED STATES PATENT AND TRADEMARK OFFICE
CERTIFICATE OF CORRECTION

PATENT NO. : 6,894,564 B1
APPLICATION NO. : 10/673095
DATED : May 17, 2005
INVENTOR(S) : Gilbert It is certified that error appears in the above-identified patent and that said Letters Patent is hereby corrected as shown below:

At column 8, line 17, please replace " $I_D = I_{CE} \cdot \dfrac{V_{BE1}}{KT/q}$ " with -- $I_D = I_{CS} \cdot \dfrac{V_{BE1}}{KT/q}$ --

At column 8, line 21, please replace " $I_D \cdot \dfrac{R_{GD} I_P V_G}{R_S I_2 KT/q}$ " with -- $I_D \cdot \dfrac{R_{GD} I_P V_G}{R_S I_Z KT/q}$ --

At column 11, line 11, please replace " $I_D e^{I\infty IT}$ " with -- $I_D e^{-I\infty/T}$ --

At column 11, line 16, please replace " $I_{SP} e^{-I\infty IT}$ " with -- $I_{SP} e^{-I\infty/T}$ --

Signed and Sealed this

Twenty-sixth Day of December, 2006

JON W. DUDAS
*Director of the United States Patent and Trademark Office*